US009613707B1

(12) United States Patent
Chen

(10) Patent No.: US 9,613,707 B1
(45) Date of Patent: Apr. 4, 2017

(54) DATA PROGRAMMING METHOD FOR AVOIDING UNAVAILABILITY OF REWRITABLE NON-VOLATILE MEMORY MODULE DUE TO HIGHER ERASE COUNT OF PART OF PHYSICAL ERASING UNITS, AND MEMORY CONTROL CIRCUIT UNIT AND MEMORY STORAGE DEVICE USING THE SAME

(71) Applicant: PHISON ELECTRONICS CORP., Miaoli (TW)

(72) Inventor: Chia-Yi Chen, Taoyuan (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 15/080,595

(22) Filed: Mar. 25, 2016

(30) Foreign Application Priority Data

Feb. 19, 2016 (TW) .............................. 105104885 A

(51) Int. Cl.
*G11C 16/14* (2006.01)
*G11C 16/34* (2006.01)

(52) U.S. Cl.
CPC .................................... *G11C 16/14* (2013.01)

(58) Field of Classification Search
CPC ......... G11C 16/14; G11C 16/10; G11C 16/12; G11C 7/24; G11C 5/141; G11C 5/148
USPC ............ 365/185.09, 185.02, 185.18, 185.05, 365/185.33
See application file for complete search history.

(56) References Cited

U.S. PATENT DOCUMENTS

| 8,289,771 | B2 * | 10/2012 | Tseng | G11C 11/5628 |
| | | | | 365/185.02 |
| 8,347,183 | B2 * | 1/2013 | Yoon | G06F 11/1068 |
| | | | | 714/752 |
| 8,902,671 | B2 * | 12/2014 | Ko | G11C 16/10 |
| | | | | 365/185.29 |
| 9,058,863 | B2 * | 6/2015 | Chen | G11C 7/222 |
| 9,086,854 | B2 * | 7/2015 | Liao | G06F 1/1681 |
| 9,141,530 | B2 * | 9/2015 | Yeh | G06F 12/0246 |
| 9,177,656 | B2 * | 11/2015 | Yeh | G11C 16/14 |
| 9,201,785 | B2 * | 12/2015 | Tan | G06F 12/0246 |
| 9,298,610 | B2 * | 3/2016 | Liang | G06F 12/0246 |
| 9,312,011 | B1 * | 4/2016 | Ko | G11C 16/14 |
| 9,324,435 | B2 * | 4/2016 | Chu | G11C 7/04 |
| 9,361,024 | B1 * | 6/2016 | Lin | G06F 12/0246 |
| 9,396,804 | B1 * | 7/2016 | Lin | G11C 16/10 |
| 9,418,731 | B1 * | 8/2016 | Watanabe | G11C 11/5635 |

(Continued)

Primary Examiner — Hien Nguyen
(74) Attorney, Agent, or Firm — Jianq Chyun IP Office

(57) ABSTRACT

A data programming method includes setting a plurality of first type physical erasing units as a current writing area and recording a current writing data amount. The method also includes calculating a data amount threshold according to the first type physical erasing units. The method still includes receiving data. The method further includes: if the current writing data amount is less than the data amount threshold, programming the data to at least one of the first type physical erasing units using a first programming mode; and if the current writing data amount is not less than the data amount threshold, setting a plurality of second type physical erasing units as the current writing area and programming the data to at least one physical erasing unit of the second type physical erasing units using a second programming mode.

18 Claims, 8 Drawing Sheets

(56) References Cited

U.S. PATENT DOCUMENTS

| | | | |
|---|---|---|---|
| 9,430,325 B2 * | 8/2016 | Liang | G06F 11/1068 |
| 9,514,819 B2 * | 12/2016 | Lin | G11C 16/0483 |
| 2016/0124679 A1 * | 5/2016 | Huang | G06F 3/0647 |
| | | | 711/103 |
| 2016/0232053 A1 * | 8/2016 | Lin | G06F 11/108 |

\* cited by examiner

DATA PROGRAMMING METHOD FOR AVOIDING UNAVAILABILITY OF REWRITABLE NON-VOLATILE MEMORY MODULE DUE TO HIGHER ERASE COUNT OF PART OF PHYSICAL ERASING UNITS, AND MEMORY CONTROL CIRCUIT UNIT AND MEMORY STORAGE DEVICE USING THE SAME

CROSS-REFERENCE TO RELATED APPLICATION

This application claims the priority benefit of Taiwan application serial no. 105104885, filed on Feb. 19, 2016. The entirety of the above-mentioned patent application is hereby incorporated by reference herein and made a part of this specification.

BACKGROUND

1. Technology Field

The present invention is directed to a data programming method and more particularly, to a data programming method, a memory control circuit unit and a memory storage device of a rewritable non-volatile memory module.

2. Description of Related Art

Along with the widespread of digital cameras, cell phones, and MP3 players in recently years, the consumers' demand to storage media has increased drastically. Because a rewritable non-volatile memory module (e.g., a flash memory) is provided with features such as data non-volatility, low power consumption, small volume, and non-mechanical structure, the rewritable non-volatile memory module is adapted to be built in the aforementioned multimedia devices.

In order to increase available capacities, a memory cell in some types of rewritable non-volatile memory modules can be used for storing a plurality of bits. Meanwhile, in order to improve a data storage speed of such types of rewritable non-volatile memory modules, physical erasing units of some of the rewritable non-volatile memory modules are further divided into different storage areas, where the physical erasing units in different storage areas are set to perform a programming operation using different programming modes. For example, the physical erasing units in one of the storage areas of a rewritable non-volatile memory module has a slower storage speed, but memory cells constructing the physical erasing units may be capable of storing a plurality of bits (that is, have a greater writable capacity) while the physical erasing units of another storage area has a faster storage speed, but memory cells constructing the physical erasing units may be capable of storing only one bit (that is, have a smaller writable capacity). Thereby, when data is received, the data may be first programmed into the storage area with the faster storage speed. Afterwards, the data may be moved to the storage area with the slower storage speed in a background operation in a proper time.

However, for the sake that the data is preferentially programmed into the physical erasing units in the storage area with the faster storage speed, an erase count of each physical erasing unit in the storage area with the faster storage speed is often much greater than an erase count of each physical erasing unit in the storage area with the slower storage speed. As a result, the erase count of each physical erasing unit in the storage area with the faster storage speed would first reach an erase count threshold, which leads to unavailability of the rewritable non-volatile memory module. Thus, the physical erasing units in the storage area with the slower storage speed will no longer be used even though the erase count of each physical erasing unit therein does not yet reach its erase count threshold, such that the lifespan of the entire rewritable non-volatile memory module is shortened.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The present invention is directed to a data programming method, a memory control circuit unit and a memory storage device capable of avoiding the issue of unavailability of the rewritable non-volatile memory module due to high erase counts of only part of physical erasing units.

According to an exemplary embodiment, a data programming method for a rewritable non-volatile memory module is provided. The rewritable non-volatile memory module includes a plurality of physical erasing units. The data programming method includes dividing the physical erasing units into a plurality of first type physical erasing units and a plurality of second type physical erasing units, wherein a programming mode of the first type physical erasing units is a first programming mode, and a programming mode of the second type physical erasing units is a second programming mode. The data programming method also includes setting the first type physical erasing units as a current writing area and recording a current writing data amount. The data programming method also includes calculating a first data amount threshold according to a first writable data amount of the first type physical erasing units and a change ratio. The data programming method further includes receiving first data and determining whether the current writing data amount is less than the first data amount threshold; and if the current writing data amount is less than the first data amount threshold, using the first programming mode to program the first data into at least one physical erasing unit of the first type physical erasing units, and updating the current writing data amount according to a data amount of the first data. The data programming method further includes, if the current writing data amount is not less than the first data amount threshold, setting the second type physical erasing units as the current writing area, resetting the current writing data amount, using the second programming mode to program the first data is programmed into at least one physical erasing unit of the second type physical erasing units, and updating the current writing data amount according to a data amount of the first data.

According to an exemplary embodiment, a memory control circuit unit for controlling a rewritable non-volatile memory module is provided. The rewritable non-volatile memory module includes a plurality of physical erasing units. The memory control circuit unit includes a host interface, a memory interface and a memory management circuit. The host interface is configured to be coupled to a host system. The memory interface is configured to be coupled to the rewritable non-volatile memory module. The memory management circuit is coupled to the host interface and the memory interface. The memory management circuit is configured to divide the physical erasing units into a plurality of first type physical erasing units and a plurality of second type physical erasing units. A programming mode of the first type physical erasing units is a first programming mode, and a programming mode of the second type physical erasing units is a second programming mode. Additionally, the memory management circuit is further configured to set the first type physical erasing units as a current writing area and record a current writing data amount. Besides, the memory management circuit is further configured to calculate a first data amount threshold according to a first writable data amount of the first type physical erasing units and a change ratio. In addition, the memory management circuit is further configured to receive first data and determine whether the current writing data amount is less than the first data amount threshold. If the current writing data amount is less than the first data amount threshold, the memory management circuit is further configured to issue a command sequence to program the first data into at least one physical erasing unit of the first type physical erasing units using the first programming mode and update the current writing data amount according to a data amount of the first data. In addition, if the current writing data amount is not less than the first data amount threshold, the memory management circuit is further configured to set the second type physical erasing units as the current writing area, reset the current writing data amount, issue a command sequence to program the first data into at least one physical erasing unit of the second type physical erasing units using the second programming mode and update the current writing data amount according to the data amount of the first data.

According to an exemplary embodiment, a memory storage device including a connection interface unit, a rewritable non-volatile memory module and a memory control circuit unit is provided. The connection interface unit is configured to be coupled to a host system. The rewritable non-volatile memory module includes a plurality of physical erasing units. The memory control circuit unit is coupled to the connection interface unit and the rewritable non-volatile memory module. The memory control circuit unit is configured to divide the physical erasing units into a plurality of first type physical erasing units and a plurality of second type physical erasing units. A programming mode of the first type physical erasing units is a first programming mode, and a programming mode of the second type physical erasing units is a second programming mode. Additionally, the memory control circuit unit is further configured to set the first type physical erasing units as a current writing area and record a current writing data amount. Besides, the memory control circuit unit is further configured to calculate a first data amount threshold according to a first writable data amount of the first type physical erasing units and a change ratio. In addition, the memory control circuit unit is further configured to receive first data and determine whether the current writing data amount is less than the first data amount threshold. If the current writing data amount is less than the first data amount threshold, the memory control circuit unit is further configured to issue a command sequence to program the first data into at least one physical erasing unit of the first type physical erasing units using the first programming mode and update the current writing data amount according to a data amount of the first data. In addition, if the current writing data amount is not less than the first data amount threshold, the memory control circuit unit is further configured to set the second type physical erasing units as the current writing area, reset the current writing data amount, issue a command sequence to program the first data into at least one physical erasing unit of the second type physical erasing units using the second programming mode and update the current writing data amount according to the data amount of the first data.

To sum up, the received write data is programmed into the physical erasing units set as the current writing area. When the current writing data amount corresponding to the current writing area reaches the set data amount threshold, the current writing area is changed, and the current writing data amount is reset. In other words, erase counts of the first type physical erasing units and the second type physical erasing units can tend to a mutual balance state by alternately setting the first type physical erasing units and the second type physical erasing units as the current writing area. In this way, the issue of unavailability of the rewritable non-volatile memory module due to the erase count of part of the physical erasing units being too high can be avoided.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
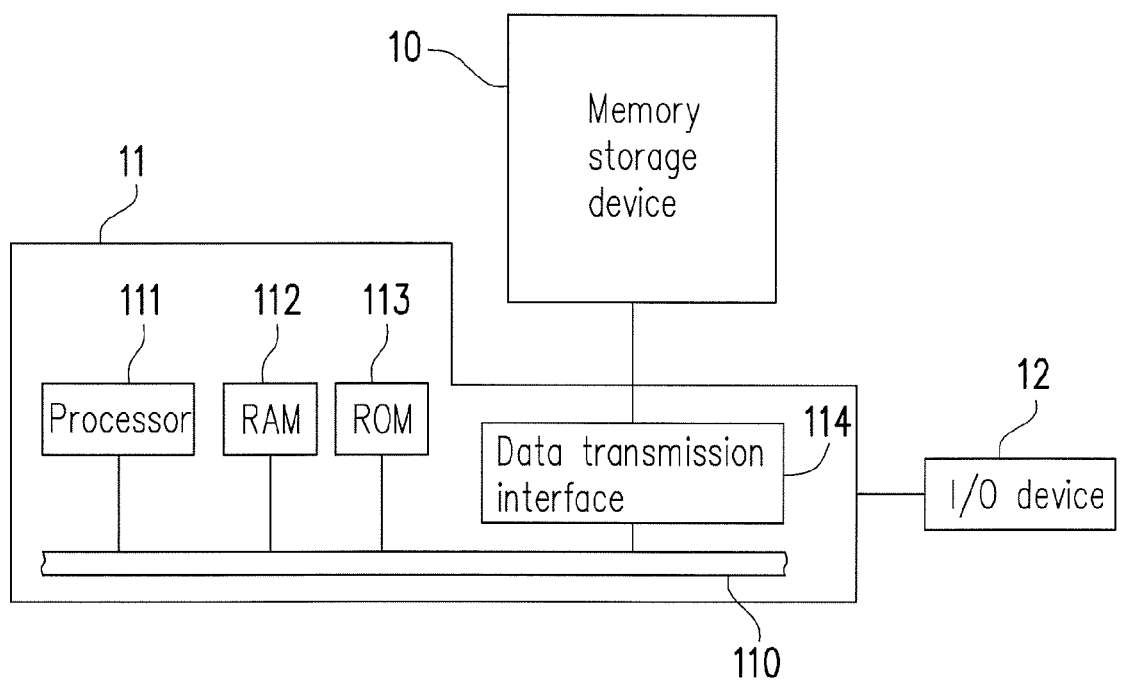
FIG. 1 is a schematic diagram illustrating host system, a memory storage device and an input/output (I/O) device according to an exemplary embodiment.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally, a memory storage device (also known as a memory storage system) includes a rewritable non-volatile memory module and a controller (also known as a control circuit). The memory storage device is usually configured together with a host system so that the host system may write data into the memory storage device or read data from the memory storage device.

Figure 2:
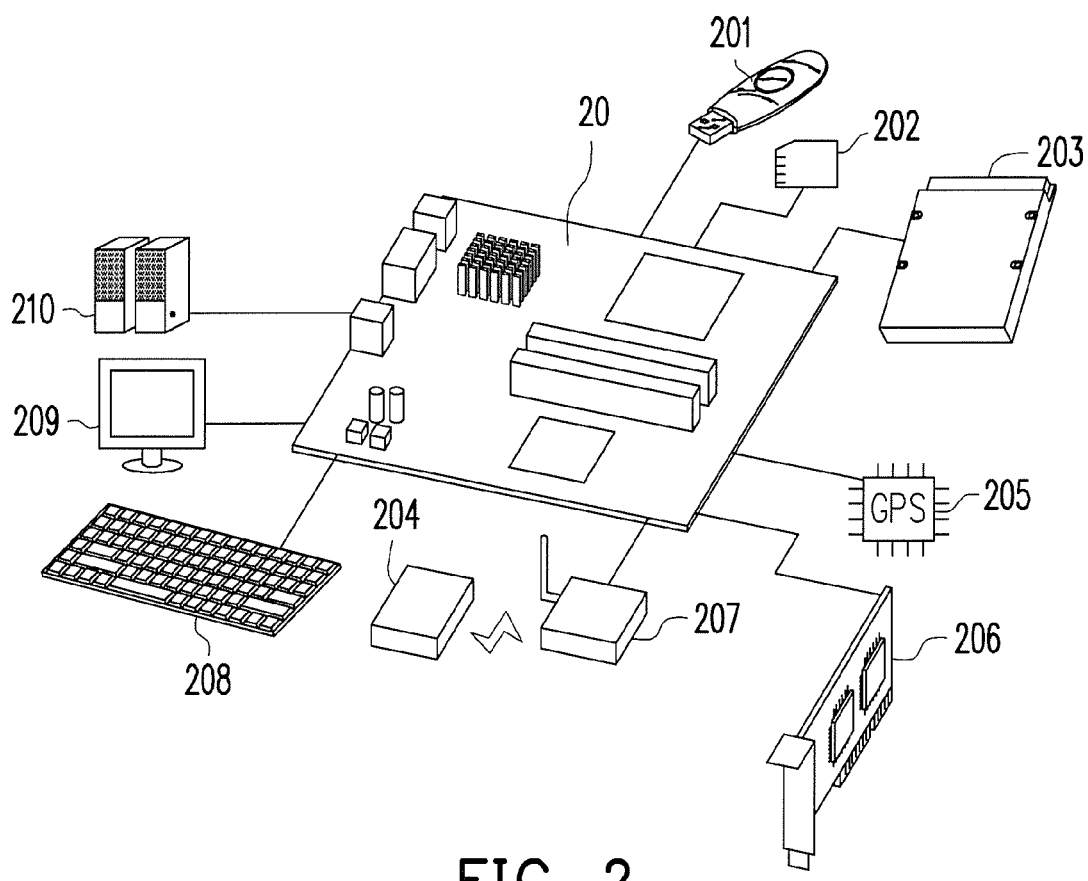
FIG. 2 is a schematic diagram illustrating a host system, a memory storage device and an I/O device according to another exemplary embodiment.

FIG. 1 is a schematic diagram illustrating host system, a memory storage device and an input/output (I/O) device according to an exemplary embodiment, and FIG. 2 is a schematic diagram illustrating a host system, a memory storage device and an I/O device according to another exemplary embodiment.

Referring to FIG. 1 and FIG. 2, a host system 11 generally includes a processor 111, a random access memory (RAM) 112, a read only memory (ROM) 113 and a data transmission interface 114. The processor 111, the RAM 112, the ROM 113 and the data transmission interface 114 are coupled to a system bus 110.

In the present exemplary embodiment, the host system 11 is coupled to a memory storage device 10 through the data transmission interface 114. For example, the host system 11 may write data into the memory storage device 10 or read data from the memory storage device 10 through the data transmission interface 114. Further, the host system 111 is coupled to an I/O device 12 through the system bus 110. For example, the host system 11 may transmit output signals to the I/O device 12 or receive input signals from the I/O device 12 through the system bus 110.

In the present exemplary embodiment, the processor 111, the RAM 112, the ROM 113 and the data transmission interface 114 are disposed on a motherboard 20 of the host system 11. The number of the data transmission interface 114 may be one or plural. Through the data transmission interface 114, the motherboard 20 may be coupled to the memory storage device 10 in a wired manner or a wireless manner. The memory storage device 10 may be, for example, a flash drive 201, a memory card 202, a solid state drive (SSD) 203 or a wireless memory storage device 204. The wireless memory storage device 204 may be, for example, a memory storage device based on various wireless communication technologies, such as a near field communication storage (NFC) memory storage device, a wireless fidelity (Wi-Fi) memory storage device, a Bluetooth memory storage device or a Bluetooth low energy (BLE) memory storage device (e.g., iBeacon). Moreover, the motherboard 20 may also be coupled to various I/O devices, such as a global positioning system (GPS) module 205, a network interface card 206, a wireless transmission device 207, a keyboard 208, a screen 209, a loudspeaker 210, etc., through the system bus 110. For example, in an exemplary embodiment, the motherboard 20 may access the wireless memory storage device 204 through the wireless transmission device 207.

Figure 3:
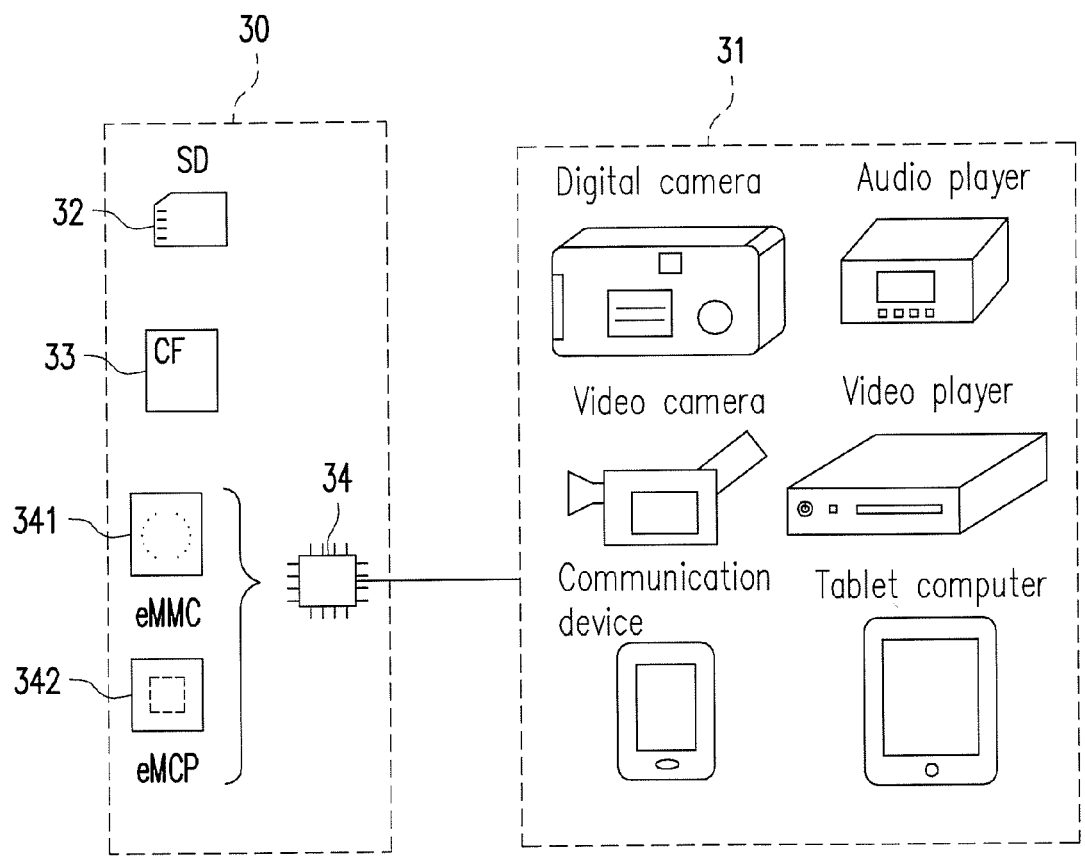
FIG. 3 is a schematic diagram illustrating a host system and a memory storage device according to another exemplary embodiment.

In an exemplary embodiment, the aforementioned host system may be any system substantially cooperated with the memory storage device for storing data. Even though the host system implemented by a computer system is taken as an example for description in the exemplary embodiment above, FIG. 3 is a schematic diagram illustrating a host system and a memory storage device according to another exemplary embodiment. Referring to FIG. 3, in another exemplary embodiment, a host system 31 may also be a system, e.g., a digital camera, a video camera, a communication device, an audio player, a video player or a tablet PC, etc., and the memory storage device 30 may be a non-volatile memory storage device, such as a secure digital (SD) card 32, a compact flash (CF) card 33, or an embedded storage apparatus 34, etc., used by the host system 31. The embedded storage apparatus 34 includes an embedded multimedia card (eMMC) 341 and/or an embedded multi chip package (eMCP) storage apparatus 342, etc., that is formed by directly coupling various memory modules to a substrate of the host system.

Figure 4:
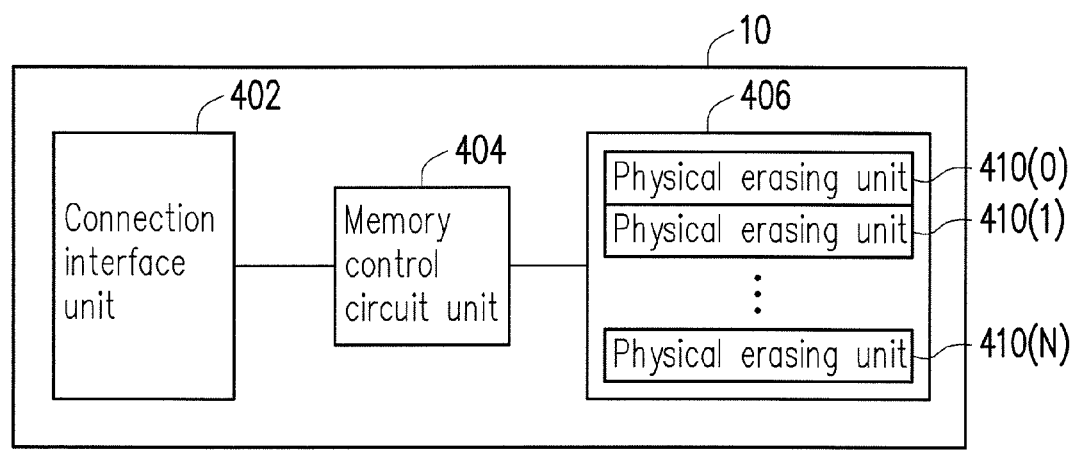
FIG. 4 is a schematic block diagram illustrating the host system and the memory storage device according to an exemplary embodiment.

FIG. 4 is a schematic block diagram illustrating the host system and the memory storage device according to an exemplary embodiment.

Referring to FIG. 4, the memory storage device 10 includes a connection interface unit 402, a memory control circuit unit 404 and a rewritable non-volatile memory module 406.

In the present exemplary embodiment, the connection interface unit 402 complies with a serial advanced technology attachment (SATA) standard. However, it should be noted that the present invention is not limited thereto, and the connection interface unit 402 may also comply with a parallel advanced technology attachment (PATA) standard, an institute of electrical and electronic engineers (IEEE) 1394 standard, a peripheral component interconnect (PCI) express standard, a universal serial bus (USB) standard, an ultra high speed-I (UHS-I) interface standard, an ultra high speed-II (UHS-II) interface standard, a secure digital (SD) interface standard, a memory stick (MS) interface standard, a multi-chip package interface standard, a multimedia card (MMC) interface standard, an embedded multimedia card (eMMC) interface standard, a universal flash storage (UFS) interface standard, an embedded multi chip package (eMCP) interface standard, a compact flash (CF) interface standard, an integrated device electronics (IDE) standard or other suitable standards. In the present exemplary embodiment, the connection interface unit 402 and the memory control circuit unit 404 may be packaged in a chip, or the connection interface unit 402 is configured outside a chip containing the memory control circuit unit.

The memory control circuit unit 404 is configured to execute a plurality of logic gates or control instructions implemented in a hardware form or a firmware form and perform operations, such as data writing, data reading and data erasing, in the rewritable non-volatile memory module 406 according to commands of the host system 11.

The rewritable non-volatile memory module 406 is coupled to the memory control circuit unit 404 and configured to store data written by the host system 11. The rewritable non-volatile memory module 406 has physical erasing units 410(0) to 410(N). For example, the physical erasing units 410(0) to 410(N) may belong to the same memory die or different memory dies. Each physical erasing unit has a plurality of physical programming units, where the physical programming units belonging to the same physical erasing unit may be separately written, but simultaneously erased altogether. However, it should be understood that the present invention is not limited thereto, and each physical erasing unit may be composed of 64 physical programming units, 256 physical programming units or any other number of physical programming units.

To be more detailed, a physical erasing unit is the smallest unit for erasing data. Namely, each physical erasing unit contains the least number of memory cells to be erased altogether. A physical programming unit is the smallest unit for programming data. Namely, the physical programming unit is the smallest unit for writing data. Each physical programming unit usually includes a data bit area and a redundant bit area. The data bit area includes a plurality of physical access addresses for storing user data, and the redundant bit area is configured for storing system data (e.g., control information and error correcting codes). In the present exemplary embodiment, the data bit area of each physical programming unit contains 8 physical access addresses, and the size of each physical access addresses is 512 bytes. However, in other exemplary embodiments, the data bit area may also contain more or less number of physical access addresses, and the size and the number of the physical access addresses are not particularly limited in the present invention. For example, in an exemplary embodiment, a physical erasing unit is a physical block, and a physical programming unit is a physical page or a physical sector, but the present invention is not limited thereto.

The rewritable non-volatile memory module 406 may be a single level cell (SLC) NAND flash memory module (i.e., a flash memory module in which a memory cell is capable of storing data of 1 bit), a multi level cell (MLC) NAND flash memory module (i.e., a flash memory module in which a memory cell is capable of storing data of 2 bits), a triple level cell (TLC) NAND flash memory module (i.e., a flash memory module in which a memory cell is capable of storing data of 3 bits), other flash memory modules or other memory modules having the same characteristics.

Each memory cell in the rewritable non-volatile memory module 406 stores one or more bits by changing a voltage (hereinafter, also known as a threshold voltage). Specifically, a charge trapping layer is provided between a control gate and a channel in each memory cell. An amount of electrons in the charge trapping layer may be changed by applying a write voltage to the control gate, so as to change the threshold voltage of the memory cell. The process of changing the threshold voltage is also referred to as "writing data into the memory cell" or "programming the memory cell". As the threshold voltage is changed, each memory cell in the rewritable non-volatile memory module 406 has a plurality of storage states. A storage state of a memory cell may be determined through applying a read voltage, and thereby, one or more bits stored in the memory cell may be obtained.

In the present exemplary embodiment, the memory cells of the rewritable non-volatile memory module 406 construct a plurality of physical programming units, and the physical programming units construct a plurality of physical erasing units. To be specific, the memory cells on a same word line construct one or more physical programming units. If each memory cell is capable of storing two or more bits, the physical programming units on the same word line may be categorized into a lower physical programming unit and an upper physical programming unit. For example, the least significant bit (LSB) of a memory cell belongs to the lower physical programming unit, and the most significant bit (MSB) of a memory cells belongs to the upper physical programming unit. Generally, in an MLC NAND flash memory, a writing speed of the lower physical programming unit is greater than a writing speed of the upper physical programming unit, and/or reliability of the lower physical programming unit is higher than reliability of the upper physical programming unit.

Figure 5:
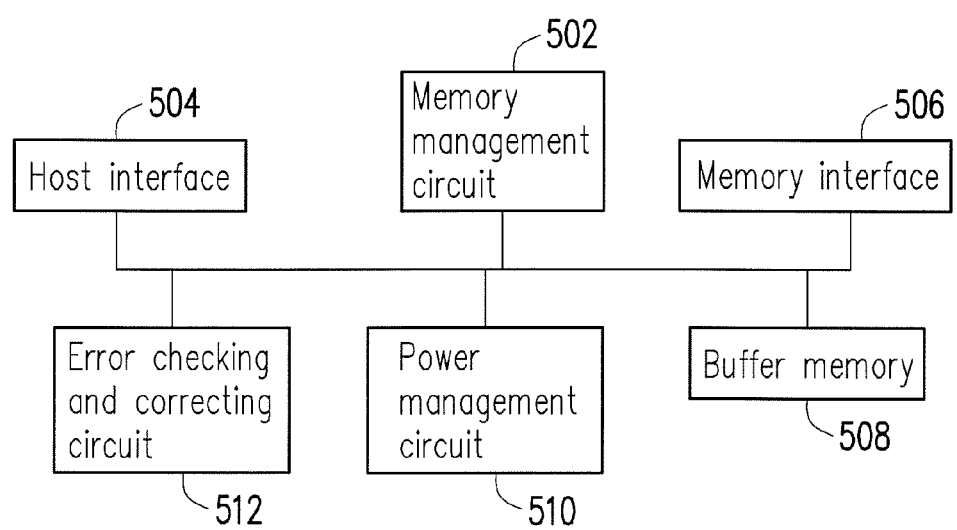
FIG. 5 is a schematic block diagram illustrating the memory control circuit unit according to an exemplary embodiment.

FIG. 5 is a schematic block diagram illustrating the memory control circuit unit according to an exemplary embodiment.

Referring to FIG. 5, the memory control circuit unit 404 includes a memory management circuit 502, a host interface 504, a memory interface 506, a buffer memory 508, a power management circuit 510 and an error checking and correcting circuit 512.

The memory management circuit 502 is configured to control overall operation of the memory control circuit unit 404. Specifically, the memory management circuit 502 has a plurality of control instructions, and when the memory storage device 10 is in operation, the control instructions are executed to perform operations, such as data writing, data reading, and data erasing.

In the present exemplary embodiment, the control instructions of the memory management circuit 502 are implemented in a firmware form. For example, the memory management circuit 502 has a microprocessor unit (not shown) and a read-only memory (ROM, not shown), and the control instructions are burnt in the ROM. When the memory storage device 10 is in operation, the control instructions are executed by the microprocessor unit to perform the operations, such as data writing, data reading and data erasing.

In another exemplary embodiment, the control instructions of the memory management circuit 502 may also be stored as program codes in a specific area (for example, a system area in a memory module exclusively used for storing system data) of the rewritable non-volatile memory module 406. In addition, the memory management circuit 502 has a microprocessor unit (not shown), a read only memory (ROM, not shown) and a random access memory (RAM, not shown). Particularly, the ROM has a boot code, and when the memory control circuit unit 404 is enabled, the microprocessor unit executes the boot code to load the control instructions from the rewritable non-volatile memory module 406 into the RAM of the memory management circuit 502. Thereafter, the control instructions are executed by the microprocessor unit to perform operations, such as data writing, data reading and data erasing.

Additionally, in another exemplary embodiment, the control instructions of the memory management circuit 502 may also be implemented in a hardware form. For example, the memory management circuit 502 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory cell management circuit is configured to manage the physical erasing units of the rewritable non-volatile memory module 406, the memory writing circuit is configured to issue a write command to the rewritable non-volatile memory module 406 to write data into the rewritable non-volatile memory module 406, the memory reading circuit is configured to issue a read command to the rewritable non-volatile memory module 406 to read data from the rewritable non-volatile memory module 406, the memory erasing circuit is configured to issue an erase command to the rewritable non-volatile memory module 406 to erase data from the rewritable non-volatile memory module 406, and the data processing circuit is configured to process data to be written into the rewritable non-volatile memory module 406 or data read from the rewritable non-volatile memory module 406.

The host interface 504 is coupled to the memory management circuit 502 and configured to be coupled to the connection interface unit 402 to receive and identify commands and data transmitted by the host system 11. That is, the commands and the data transmitted by the host system 11 are transmitted to the memory management circuit 502 through the host interface 504. In the present exemplary embodiment, the host interface 504 complies with the SATA standard. However, it should be understood that the present invention is not limited thereto, host interface 504 the host interface 504 may also comply with the PATA standard, the IEEE 1394 standard, the PCI Express standard, the USB standard, the UHS-I interface standard, the UHS-II interface standard, the SD standard, the MS standard, the MMC standard, the CF standard, the IDE standard or other suitable data transmission standards.

The memory interface 506 is coupled to the memory management circuit 502 and configured to access the rewritable non-volatile memory module 406. That is, the data to be written into the rewritable non-volatile memory module 406 is converted to an acceptable format for the rewritable non-volatile memory module 406 through the memory interface 506.

The buffer memory 508 is coupled to the memory management circuit 502 configured to temporarily store data and commands from the host system 11 or data from the rewritable non-volatile memory module 406.

The power management circuit 510 is coupled to the memory management circuit 502 and configured to control the power of the memory storage apparatus 10.

The error checking and correcting circuit 512 is coupled to the memory management circuit 502 and configured to perform an error checking and correcting procedure to ensure data accuracy. Specifically, when the memory management circuit 502 receives a write command from the host system 11, the error checking and correcting circuit 512 generates an error checking and correcting code (ECC code) for data corresponding to the write command, and the memory management circuit 502 writes the data corresponding to the write command and the corresponding ECC code into the rewritable non-volatile memory module 406. Thereafter, when reading the data from the rewritable non-volatile memory module 406, the memory management circuit 502 also reads the ECC code corresponding to the data, and the error checking and correcting circuit 512 performs the error checking and correcting procedure on the read data according to the ECC code.

Figure 6A:
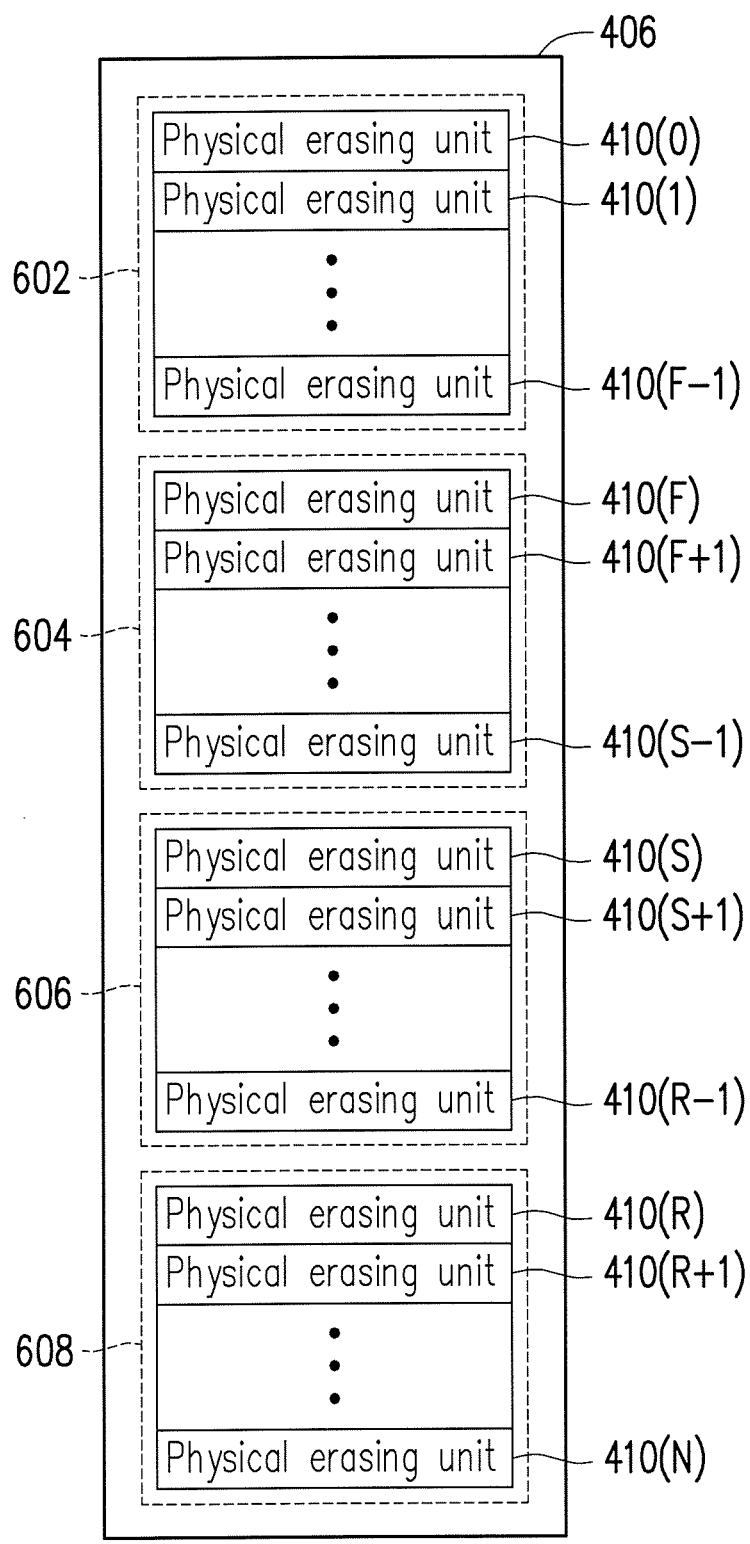
FIGS. 6A to 6B are schematic diagrams illustrating examples of the management of the physical erasing units according to an exemplary embodiment.
Figure 6B:
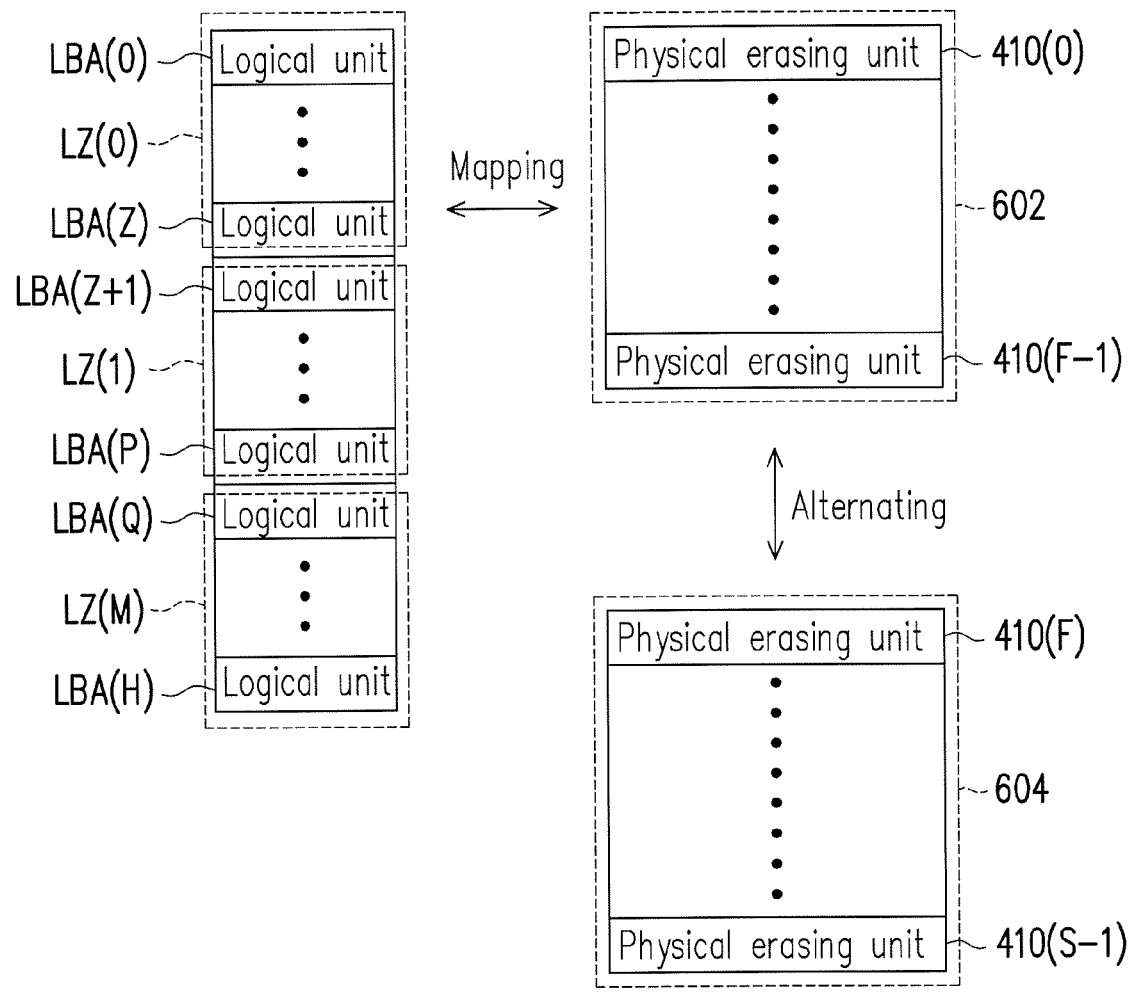

FIGS. 6A to 6B are schematic diagrams illustrating examples of the management of the physical erasing units according to an exemplary embodiment.

It should be understood that in description of the operations of the physical erasing units of the rewritable non-volatile memory module 406, the terms "get", "select", "group", "divide", "associate" and so on used for the physical erasing units are logical concepts. Namely, the physical erasing units of the rewritable non-volatile memory module are operated logically, while actual locations of the physical erasing units of the rewritable non-volatile memory module 406 are not changed.

Referring to FIG. 6A, the memory control circuit unit 404 (or the memory management circuit 502) logically groups the physical erasing units 410(0) to 410(N) into a data area 602, a spare area 604, a system area 606 and a replacement area 608.

The physical erasing units logically belonging to the data area 602 and the spare area 604 are configured to store data from the host system 11. Specifically, the physical erasing units belonging to the data area 602 are considered as physical erasing units with data stored therein, and the physical erasing units belonging to the spare area 604 are used to replace the physical erasing units of the data area 602. In other words, when receiving a write command and data to be written from the host system 11, the memory management circuit 502 selects a physical erasing unit from the spare area 604 and writes the data into the selected physical erasing unit to replace the physical erasing unit in the data area 602.

The physical erasing units logically belonging to the system area 606 are configured to record system data. For example, the system data includes a manufacturer and a model with respect to the rewritable non-volatile memory module, the number of the physical erasing units in the rewritable non-volatile memory module, and the number of the physical programming units of each physical erasing unit.

The physical erasing units logically belonging to the replacement area 608 are used for a bad physical erasing unit replacement procedure to replace damaged physical erasing units. Specifically, if there are normal physical erasing units in the replacement area 608, and a physical erasing unit in the data area 602 is damaged, the memory management circuit 502 selects a normal physical erasing unit from the replacement area 608 to replace the damaged physical erasing units.

Specially, the number of the physical erasing units belonging to the data area 602, the spare area 604, the system area 606 and the replacement area 608 vary with different memory types. Additionally, it should be understood that in the operation of the memory storage device 10, a grouping relationship of associating the physical erasing units with the data area 602, the spare area 604, the system area 606 and the replacement area 608 is dynamically changed. For example, when a physical erasing unit in the spare area 604 is damaged and replaced by a physical erasing unit from the replacement area 608, the physical erasing unit previously in the replacement area 608 is associated with the spare area 604.

Referring to FIG. 6B, the memory control circuit unit 404 (or the memory management circuit 502) configures logical units LBA(0) to LBA(H) for mapping the physical erasing units in the data area 602, where each logical unit has a plurality of logical sub units for being mapped to the physical programming units of the corresponding physical erasing unit. Meanwhile, when the host system 11 is to write data into a logical unit or to update data stored in the logical unit, the memory control circuit unit 404 (or the memory management circuit 502) selects a physical erasing unit from the spare area 604 for writing the data to substitute for the physical erasing unit in the data area 602. In the present exemplary embodiment, a logical sub unit may be a logical page or a logical sector.

In order to identify which physical erasing unit the data of each logical address is stored in, in the present exemplary embodiment, the memory control circuit unit 404 (or the memory management circuit 502) records a mapping relationship between the logical units and the physical erasing units. Meanwhile, when the host system 11 is to access data in a logical sub unit, the memory control circuit unit 404 (or the memory management circuit 502) identifies a logical unit which the logical sub unit belongs to, and access the data in a physical erasing unit which the logical unit is mapped to. For example, in the present exemplary embodiment, the memory control circuit unit 404 (or the memory management circuit 502) stores a logical-physical address mapping table in the rewritable non-volatile memory module 406 for recording the physical erasing unit which each logical unit is mapped to, and when intending to access data, the memory control circuit unit 404 (or the memory management circuit 502) loads the logical-physical address mapping table into the buffer memory 508 for maintaining.

It should be mentioned that the buffer memory 508 may be incapable of recording mapping tables recording the mapping relations of all logical units due to its limited capacity. Thus, in the present exemplary embodiment, the memory control circuit unit 404 (or the memory management circuit 502) groups the logical units LBA(0) to LBA (H) into a plurality of logical zones LZ(0) to LZ(M) and assigns one logical address mapping table for each logical zone. Specially, when the memory control circuit unit 404 (or the memory management circuit 502) is to update the mapping with respect to a certain logical unit, the logical-physical address mapping table of the logical zone corresponding to the logical unit is loaded into the buffer memory 508 and is then updated.

In the present exemplary embodiment, the memory control circuit unit 404 (or the memory management circuit 502) selects at least part of the physical erasing units in the rewritable non-volatile memory module 406 as first type physical erasing units, and sets a programming mode of the first type physical erasing units as a first programming mode. And, the memory control circuit unit 404 (or the memory management circuit 502) also selects at least another part of the physical erasing units in the rewritable non-volatile memory module 406 as second type physical erasing units, and sets a programming mode of the second type physical erasing units as a second programming mode. In the present exemplary embodiment, data is programmed into the first type physical erasing units only using the first programming mode, and data is programmed into the second type physical erasing units only using the second programming mode. Namely, after data of a specific first type physical erasing unit is erased, another data is programmed into the first type physical erasing unit still using the first programming mode, instead of using the second programming mode. Similarly, after data of a specific second type physical erasing unit is erased, another data is programmed into the second type physical erasing unit still using the second programming mode, instead of using the first programming mode.

In addition, the memory control circuit unit 404 (or the memory management circuit 502) may also consider the first type physical erasing units as a storage area and configures the second type physical erasing units as another storage area for management.

Generally, a speed of programming the memory cells based on the first programming mode is faster than a speed of programming the memory cells based on the second programming mode. Reliability of data which is stored based on the first programming mode is usually higher than reliability of data which is stored based on the second programming mode.

In the present exemplary embodiment, the first programming mode refers to one of a single layer memory cell (SLC) mode, a lower physical programming mode, a mixture programming mode and a less layer memory cell mode. In the SLC mode, a memory cell stores data of only 1 bit. In the lower physical programming mode, only the lower physical programming unit is programmed while the upper physical programming unit corresponding to the lower physical programming unit may not be programmed. In the mixture programming mode, valid data (or real data) is programmed into the lower physical programming unit while dummy data is programmed into the upper physical programming unit corresponding to the lower physical programming unit in which the valid data is stored. In the less layer memory cell mode, a memory cell stores data of bits in a first number. For example, the first number may be set as "1".

In the present exemplary embodiment, the second programming mode refers to a multiple layer cell (MLC) programming mode, a trinary level cell (TLC) programming mode or a similar mode. In the second programming mode, a memory cell stores data of bits in a second number, where the second number is equal to or greater than "2". For example, the second number may be set as 2 or 3. In another exemplary embodiment, both the first number in the first programming mode and the second number in the second programming mode may be other numbers as long as satisfying the condition that the second number is greater than the first number. In other words, the number (i.e., the first number) of bit data stored by each of the memory cells constructing the first type physical erasing units after being programmed using the first programming mode is less than the number (i.e., the second number) of bit data stored by each of the memory cells constructing the second type physical erasing units after being programmed using the second programming mode.

Figure 7:
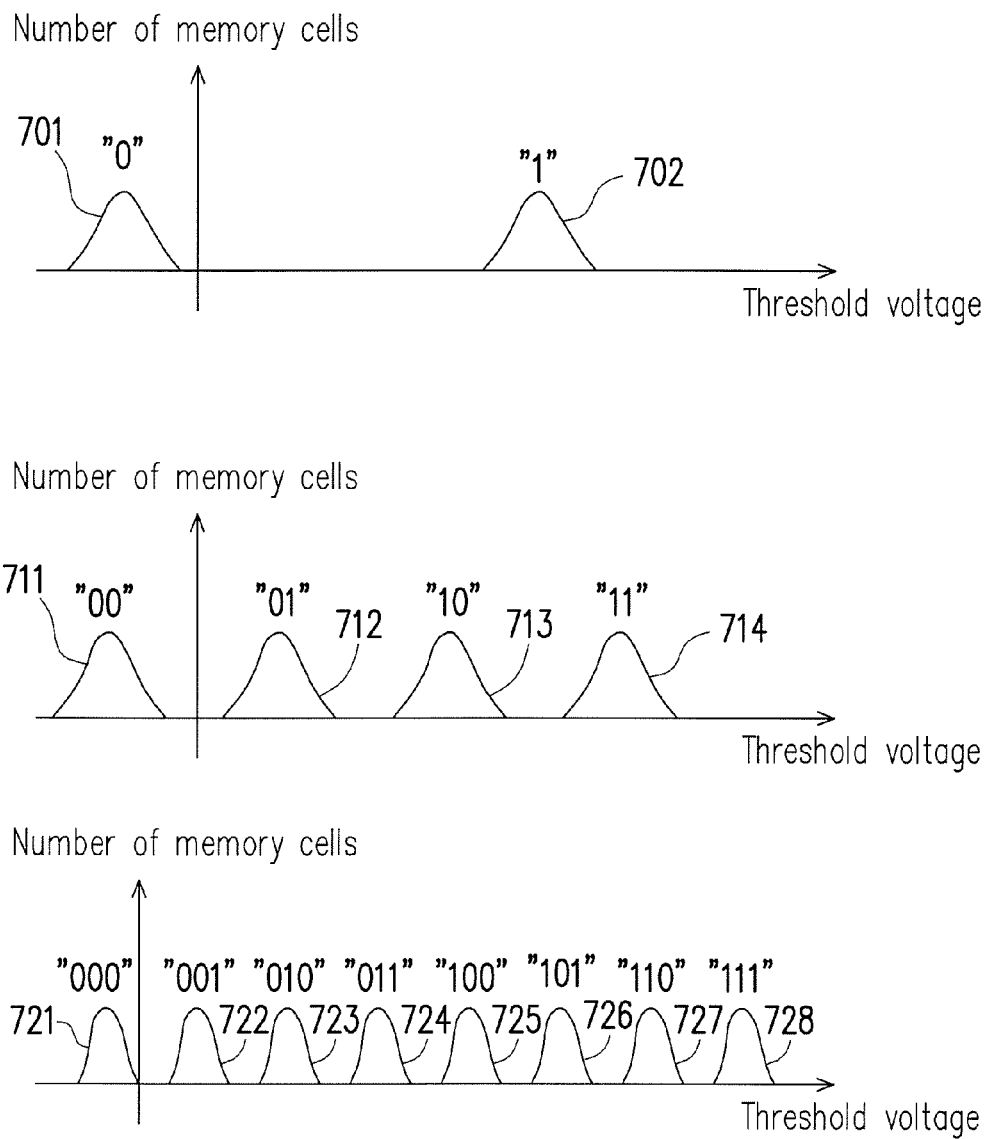
FIG. 7 is a schematic diagram illustrating threshold voltage distributions of the memory cells according to an exemplary embodiment.

FIG. 7 is a schematic diagram illustrating threshold voltage distributions of the memory cells according to an exemplary embodiment.

Referring to FIG. 7, in the present exemplary embodiment, in case where a plurality of memory cells are programmed based on the first programming mode, threshold voltage distributions of the programmed memory cells may include distributions 701 and 702. For example, if a certain memory cell is programmed to store a bit of "0", a threshold voltage of the memory cell belongs to the distribution 701, and if a certain memory cell is programmed to store a bit of "1", a threshold voltage of the memory cell belongs to the distribution 702. However, in another exemplary embodiment, the memory cell with the threshold voltage belonging to the distribution 701 may also be configured to store the bit of "1", and the memory cell with the threshold voltage belonging to the distribution 702 may also be configured to store the bit of "0". In addition, in case a plurality of memory cells are programmed based on the second programming mode, threshold voltage distributions of the programmed memory cells may include distributions 711 to 714 or distributions 721 to 728.

In an exemplary embodiment where the second number is "2", if a certain memory cell is programmed to store bits of "00", a threshold voltage of the memory cell belongs to the distribution 711, if a certain memory cell is programmed to store bits of "01", a threshold voltage of the memory cell belongs to the distribution 712, if a certain memory cell is programmed to store bits of "10", a threshold voltage of the memory cell belongs to the distribution 713, and if a certain memory cell is programmed to store bits of "11", the threshold voltage of the memory cell belongs to the distribution 714. However, in another exemplary embodiment, the memory cells with the threshold voltages belonging to the distributions 711 to 714 may also be configured to store the bits of "11", "10", "01" and "00", respectively or other bit values having a total bit number of "2".

In an exemplary embodiment where the second number is "3", memory cells with the threshold voltages belonging to the distributions 721 to 728 are configured to store bits of "000", "001", "010", "011", "100", "101", "110" and "111", respectively. However, in another exemplary embodiment, the memory cells with the threshold voltages belonging to the distributions 721 to 728 may also be configured to store the bits of "111", "110", "101", "100", "011", "010", "001" and "000", respectively or other bit values having a total bit number of "3".

For descriptive convenience, in the exemplary embodiment below, the less layer memory cell mode in which each memory cell stores the data of "1" bit is illustrated as an example of the first programming mode, and the programming mode in which each memory cell stores the data of "2" or "3" bits is illustrated as an example of the second programming mode. However, in other exemplary embodiments, any kind of the first programming mode and the second programming mode may be adopted as long as aforesaid condition is satisfied.

The memory control circuit unit 404 (or the memory management circuit 502) writes the received data into the first type physical erasing units and the second type physical erasing units in turn. In other words, the memory control circuit unit 404 (or the memory management circuit 502) operates the rewritable non-volatile memory module 406 using the first programming mode and the second programming mode alternately. When a write command is received from the host system 11, the memory control circuit unit 404 (or the memory management circuit 502) determines whether to change a current writing area according to a current writing data amount of the data written into the physical erasing units set as the current writing area.

To be specific, the memory control circuit unit 404 (or the memory management circuit 502) may set alternately the first type physical erasing units and the second type physical erasing units as the current writing area. It is to be mentioned that in the present exemplary embodiment, the memory control circuit unit 404 (or the memory management circuit 502) may initially set the first type physical erasing units as the current writing area in the beginning of the operation. However, in another exemplary embodiment, the memory control circuit unit 404 (or the memory management circuit 502) may also initially set the second type physical erasing units as the current writing area in the beginning of the operation. The initial setting of the current writing area is not limited in the present invention. In addition, the memory control circuit unit 404 (or the memory management circuit 502) also records the current writing data amount corresponding to the current writing area and determine whether to change the current writing area according to the current writing data amount. In other words, the current writing data amount refers to an amount of the data written into the physical erasing units which are set as the current writing area during the period that the current writing area is set. Thus, when the current writing area is changed, the current writing data amount is re-calculated, for example, the current writing data amount is reset as 0.

To be more detailed, the memory control circuit unit 404 (or the memory management circuit 502) sets a data amount threshold (also referred to as a first data amount threshold hereinafter) corresponding to the first type physical erasing units and a data amount threshold (also referred to as a second data amount threshold hereinafter) corresponding to the second type physical erasing units in advance and determines whether to change the setting of the current writing area according to whether the current writing data amount is greater than the set data amount thresholds. In the present exemplary embodiment, the memory control circuit unit 404 (or the memory management circuit 502) calculates the first data amount threshold according to a first writable data amount of the first type physical erasing units and calculates the second data amount threshold according to a second writable data amount of the second type physical erasing units. For example, the first writable data amount may be calculated according to a capacity of one first type physical erasing unit using the first programming mode, the number of all the first type physical erasing units and a maximum erase count of one first type physical erasing unit using the first programming mode. Similarly, the second writable data amount may be calculated according to a capacity of one second type physical erasing unit using the second programming mode, the number of all the second type physical erasing units and a maximum erase count of one second type physical erasing unit using the second programming mode. Namely, the writable data amount is used for indicating a data amount of the data which is allowed to be written into a physical erasing unit within a life cycle in a physical erasing unit (i.e., before an erase count of the physical erasing unit reaches an upper limit).

In addition, the memory control circuit unit 404 (or the memory management circuit 502) may also set a change ratio, calculate the first data amount threshold according to the first writable data amount and the change ratio, and calculate the second data amount threshold according to the second writable data amount and the change ratio. For example, the first data amount threshold and the second data amount threshold may be calculated respectively by multiplying the first writable data amount by the change ratio and multiplying the second writable data amount by the change ratio. The calculated first data amount threshold is less than a total capacity of all the first type physical erasing units, and the calculated second data amount threshold is less than a total capacity of all the second type physical erasing units. In this case, the total capacity of all the first type physical erasing units is equal to the capacity of one first type physical erasing unit multiplied by the number of all the first type physical erasing units, and the total capacity of all the second type physical erasing units is equal to the capacity of one second type physical erasing units multiplied by the number of all the second type physical erasing units. In other words, whenever the first type physical erasing units are written with a specific amount of data, data then is changed to be written into the second type physical erasing units. Similarly, whenever the second type physical erasing units are written with a specific amount of data, data then is changed to be written into the first type physical erasing units. Thereby, a use degree between the first type physical erasing units and the second type physical erasing units may be balanced. In the present exemplary embodiment, the memory control circuit unit 404 (or the memory management circuit 502) sets the change ratio according to the total capacity of all the first type physical erasing units. Nevertheless, the change ratio may be set based on actual applications, and the setting of the change ratio is not particularly limited in the present invention. In another exemplary embodiment, the memory control circuit unit 404 (or the memory management circuit 502) may also set the change ratio according to the total capacity of all the second type physical erasing units.

For instance, if it is assumed that the capacity of one first type physical erasing unit using the first programming mode is m1 bytes, the number of all the first type physical erasing units is n1, a maximum erase count of one first type physical erasing unit using the first programming mode is k1 times, and thus, the first writable data amount of the first type physical erasing units is multiplied by m1, n1, and k1. Further, if it is assumed that the change ratio is set as p %, then, the first data amount threshold is multiplied by m1×n1, k1, and p %. Similarly, if it is assumed that the capacity of one second type physical erasing unit using the second programming mode is m2 bytes, the number of all the second type physical erasing units is n2, a maximum erase count of one second type physical erasing unit using the second programming mode is k2 times, and the second data amount threshold is multiplied by m2, n2, k2 and p %.

If it is assumed that the current writing area is set as the first type physical erasing units, and the current writing data amount reaches (i.e., greater than or equal to) the first data amount threshold, the memory control circuit unit 404 (or the memory management circuit 502) changes the current writing area and sets the second type physical erasing units as the current writing area. When the current writing area is changed, the current writing data amount is reset, and the current writing data amount corresponding to the changed current writing area is re-recorded. If the current writing data amount after the second type physical erasing units are set as the current writing area reaches the second data amount threshold, the memory control circuit unit 404 (or the memory management circuit 502) changes the current writing area again and sets the first type physical erasing units as the current writing area.

Figure 8A:
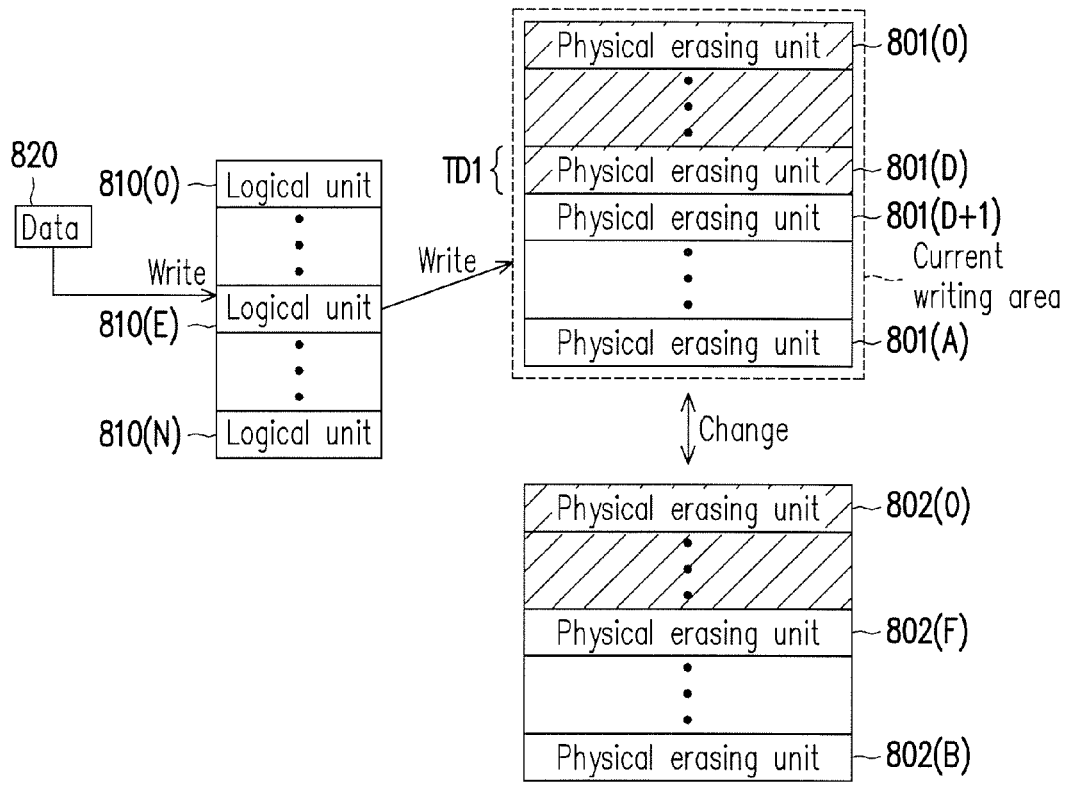
FIGS. 8A to 8B are schematic diagrams of programming write data into the current writing area according to an exemplary embodiment.
Figure 8B:
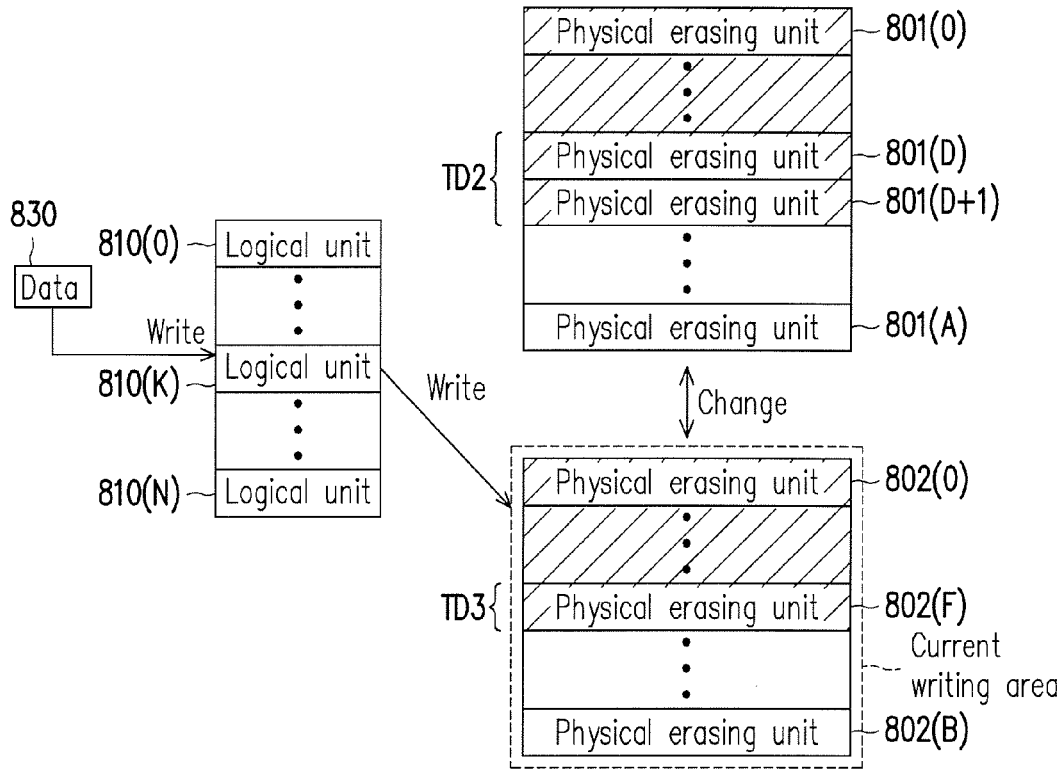

FIGS. 8A to 8B are schematic diagrams of programming write data into the current writing area according to an exemplary embodiment.

Referring to FIG. 8A, physical erasing units 801(0) to 801(A) are selected as first type physical erasing units which are programmed using a first programming mode and physical erasing units 802(0) to 802(B) are selected as second type physical erasing units which are programmed using a second programming mode (in which the physical erasing units stored with data are represented by hatched lines). As illustrated in FIG. 8A, it is assumed that the first type physical erasing units are set as a current writing area.

After the first type physical erasing units are set as the current writing area, a current writing data amount corresponding to the first type physical erasing units is a data amount TD1, and the current writing data amount (i.e., the data amount TD1) is less than a previously calculated first data amount threshold. When data 820 to be written into a logical unit 810(E) is received, the data 820 is stored in the current writing area since the memory control circuit unit 404 (or the memory management circuit 502) determines that the current writing data amount (i.e., the data amount TD1) does not yet reaches the first data amount threshold. For example, the memory control circuit unit 404 (or the memory management circuit 502) issues a command sequence (i.e., a write command sequence) to the rewritable non-volatile memory module 406 to instruct to write (i.e., program) the data 820 into at least one physical erasing unit of the first type physical erasing units using the first programming mode. In this case, the command sequence may include one or a plurality of command codes or program codes.

Then, the memory control circuit unit 404 (or the memory management circuit 502) updates the current writing data amount according to a data amount of the written data 820. Referring to FIG. 8B, after the data 820 is programmed, the current writing data amount is updated as a data amount TD2 according to the data amount of the data 820. In other words, before the current writing area is changed, the memory control circuit unit 404 (or the memory management circuit 502) continuously programs the received write data into the first type physical erasing units and updates the current writing data amount according to the data amount of each write data. When the memory control circuit unit 404 (or the memory management circuit 502) determines that the current writing data amount reaches the first data amount threshold, the memory control circuit unit 404 (or the memory management circuit 502) changes the current writing area, sets the second type physical erasing units as the current writing area and programs the write data into the second type physical erasing units. Otherwise, the memory control circuit unit 404 (or the memory management circuit 502) does not change the current writing area and continues to program the received write data into the first type physical erasing units.

Further referring to FIG. 8B, if it is assumed that the memory control circuit unit 404 (or the memory management circuit 502) determines that current writing data amount (i.e., the data amount TD2) reaches the first data amount threshold, the memory control circuit unit 404 (or the memory management circuit 502) changes the current writing area and sets the second type physical erasing units as the current writing area. Namely, the memory control circuit unit 404 (or the memory management circuit 502) changes to program the received data into the second type physical erasing units using the second programming mode. Meanwhile, the memory control circuit unit 404 (or the memory management circuit 502) resets the current writing data amount as 0 and re-calculates the current writing data amount after the second type physical erasing units are set as the current writing area. For example, after the second type physical erasing units are set as the current writing area, and when a write command instructing to write data 830 into a logical unit 810(K) is received, the memory control circuit unit 404 (or the memory management circuit 502) issues another command sequence to instruct to program the data 830 into at least one physical erasing unit of the second type physical erasing units using the second programming mode.

Afterwards, the memory control circuit unit 404 (or the memory management circuit 502) updates the current writing data amount according to a data amount of the data 830. Referring to FIG. 8B, after the data 830 is programmed, the current writing data amount is updated as a data amount TD3 according to the data amount of the data 830. In other words, before the current writing area is changed, the memory control circuit unit 404 (or the memory management circuit 502) continuously programs the received write data into the second type physical erasing units and updates the current writing data amount according to the data amount of each write data. When the memory control circuit unit 404 (or the memory management circuit 502) determines that the current writing data amount reaches a second data amount threshold, the memory control circuit unit 404 (or the memory management circuit 502) changes the current writing area again and sets the first type physical erasing units as the current writing area. For example, if the updated current writing data amount (i.e., the data amount TD3) is determined as reaching the second data amount threshold, the memory control circuit unit 404 (or the memory management circuit 502) changes the current writing area again and sets the first type physical erasing units as the current writing area.

Figure 9:
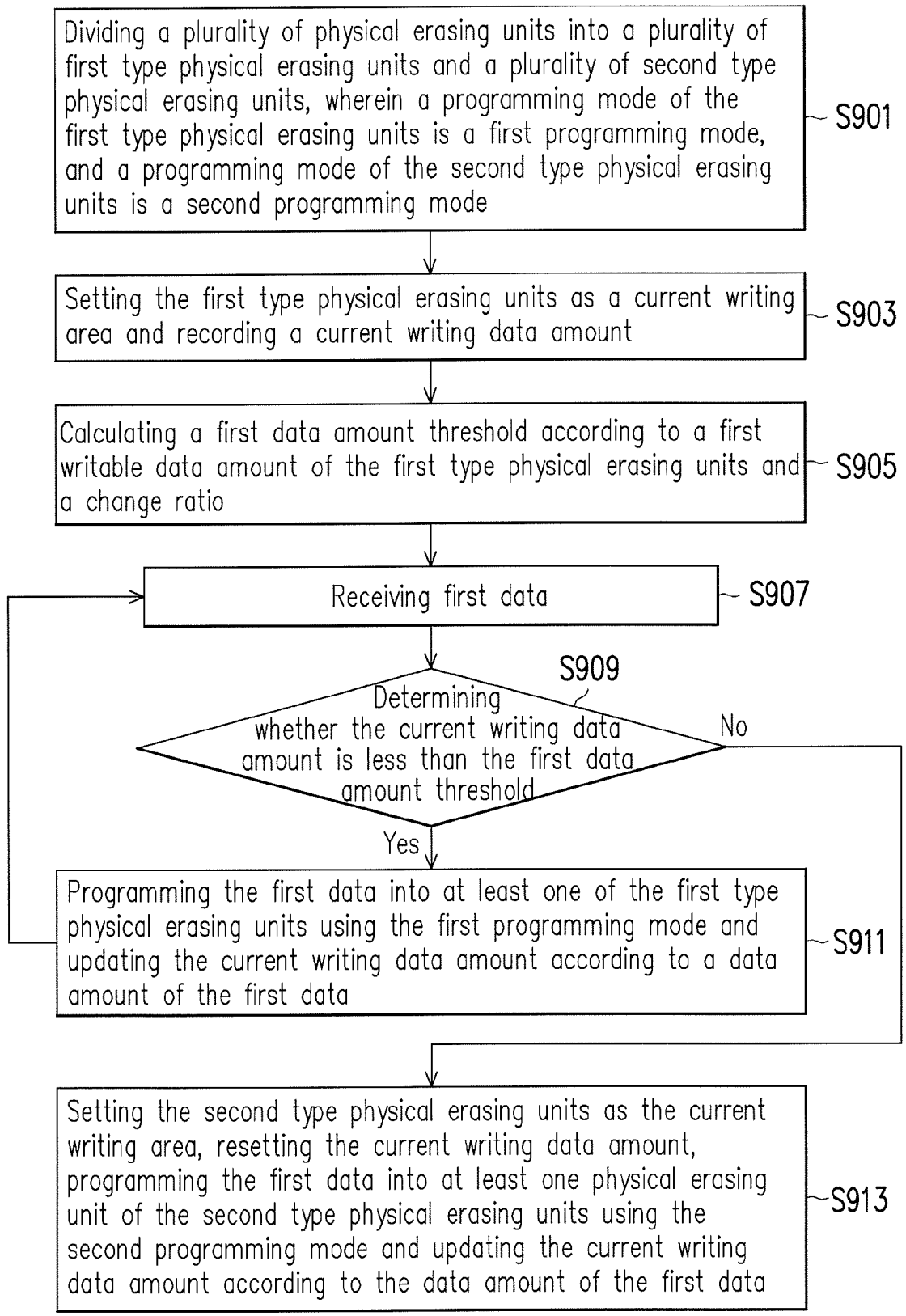
FIG. 9 is a flowchart illustrating a data programming method according to an exemplary embodiment.

FIG. 9 is a flowchart illustrating a data programming method according to an exemplary embodiment.

Referring to FIG. 9, in step S901, the memory control circuit unit 404 (or the memory management circuit 502) divides a plurality of physical erasing units of the rewritable non-volatile memory module 406 into a plurality of first type physical erasing units and a plurality of second type physical erasing units, wherein a programming mode of the first type physical erasing units is a first programming mode, and a programming mode of the second type physical erasing units is a second programming mode.

In step S903, the memory control circuit unit 404 (or the memory management circuit 502) sets the first type physical erasing units as a current writing area and records a current writing data amount.

In step S905, the memory control circuit unit 404 (or the memory management circuit 502) calculates a first data amount threshold according to a first writable data amount of the first type physical erasing units and a change ratio.

In step S907, the memory control circuit unit 404 (or the memory management circuit 502) receives first data.

In step S909, the memory control circuit unit 404 (or the memory management circuit 502) determines whether the current writing data amount is less than the first data amount threshold.

If determining that the current writing data amount is less than the first data amount threshold, in step S911, the memory control circuit unit 404 (or the memory management circuit 502) issues a command sequence to program the first data into at least one of the first type physical erasing units using the first programming mode and updates the current writing data amount according to a data amount of the first data.

If determining that the current writing data amount is not less than the first data amount threshold, in step S913, the memory control circuit unit 404 (or the memory management circuit 502) sets the second type physical erasing units as the current writing area, resets the current writing data amount, issues a command sequence to program the first data into at least one physical erasing unit of the second type physical erasing units using the second programming mode and updates the current writing data amount according to the data amount of the first data.

However, each step illustrated in FIG. 9 has been described in detail in the above and thus, will not be repeated. It should be noted that the each of the steps illustrated in FIG. 9 may be implemented as a plurality of program codes or circuits, which is not limited in the present invention. Moreover, the method illustrated in FIG. 9 may be operated with the exemplary embodiments described above or used alone, which is not limited in the present invention.

After step S911, the memory control circuit unit 404 (or the memory management circuit 502) continues to receive data (step S907) and determine whether the current writing data amount is less than the first data amount threshold (step S909) to determine whether to program the received data into the first type physical erasing units (step S911) or the second type physical erasing units (step S913).

Additionally, after step S913, the memory control circuit unit 404 (or the memory management circuit 502) determines whether the updated current writing data amount is less than a second data amount threshold. If determining that the current writing data amount is less than the second data amount threshold, the memory control circuit unit 404 (or the memory management circuit 502) issues a write command sequence to program the data into the second type physical erasing units using the second programming mode and updates the current writing data amount. If determining that the current writing data amount is not less than the second data amount threshold, the memory control circuit unit 404 (or the memory management circuit 502) sets the first type physical erasing units as the current writing area, resets the current writing data amount, issues a write command to program the data into first type physical erasing units using the first programming mode and updates the current writing data amount.

It should be noted that in the present exemplary embodiment, the step of determining whether the current writing data amount is less than the first data amount threshold (i.e., step S909) is performed after the step of receiving the first data (i.e., step S907), but the present invention is not limited thereto. In another exemplary embodiment, the memory control circuit unit 404 (or the memory management circuit 502) may also determine whether the current writing data amount is less than the first data amount threshold immediately after updating the current writing data amount. When determining that the current writing data amount is not less than the first data amount threshold, the memory control circuit unit 404 (or the memory management circuit 502) may immediately change the current writing area and program the subsequently received data in the changed current writing area.

To summarize, in the scenario that the current writing area is the first type physical erasing units, when the current writing data amount of the first type physical erasing units is not less than the first data amount threshold, the current writing area is changed as the second type physical erasing units, and the current writing data amount is reset. After the current writing area is changed as the second type physical erasing units, when the current writing data amount of the second type physical erasing units not less than the second data amount threshold, the current writing area is changed as the first type physical erasing units again, and the current writing data amount is reset again. By controlling the current writing data amount of the data programmed into the physical erasing units whenever the current writing area is changed, the write data is programmed into the first type physical erasing units and the second type physical erasing units alternately. Thereby, the erase counts of the first type physical erasing units and the erase counts of the second type physical erasing units can tend to balance, so as to avoid unavailability of the rewritable non-volatile memory module due to the erase count of part of the physical erasing units being too high. Therefore, the reliability of the rewritable non-volatile memory module can be improved. The previously described exemplary embodiments of the present invention have the advantages aforementioned, wherein the advantages aforementioned not required in all versions of the invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A data programming method for a rewritable non-volatile memory module, wherein the rewritable non-volatile memory module comprises a plurality of physical erasing units, the data programming method comprising:

dividing the physical erasing units into a plurality of first type physical erasing units and a plurality of second type physical erasing units, wherein a programming mode of the first type physical erasing units is a first programming mode, and a programming mode of the second type physical erasing units is a second programming mode;

setting the first type physical erasing units as a current writing area and recording a current writing data amount;

calculating a first data amount threshold according to a first writable data amount of the first type physical erasing units and a change ratio;

receiving first data;

determining whether the current writing data amount is less than the first data amount threshold;

if the current writing data amount is less than the first data amount threshold, programming the first data into at least one physical erasing unit of the first type physical erasing units using the first programming mode and updating the current writing data amount according to a data amount of the first data; and if the current writing data amount is not less than the first data amount threshold, setting the second type physical erasing units as the current writing area, resetting the current writing data amount, programming the first data into at least one physical erasing unit of the second type physical erasing units using the second programming mode and updating the current writing data amount according to the data amount of the first data.

2. The data programming method according to claim 1, further comprising:

calculating a second data amount threshold according to a second writable data amount of the second type physical erasing units and the change ratio.

3. The data programming method according to claim 2, wherein after the step of setting the second type physical erasing units as the current writing area and resetting the current writing data amount, the method further comprising:

receiving second data;

determining whether the current writing data amount is less than the second data amount threshold;

if the current writing data amount is less than the second data amount threshold, programming the second data into at least one physical erasing unit of the second type physical erasing units using the second programming mode and updating the current writing data amount according to a data amount of the second data; and if the current writing data amount is not less than the second data amount threshold, setting the first type physical erasing units as the current writing area, resetting the current writing data amount, programming the second data into at least one of the first type physical erasing units using the first programming mode and updating the current writing data amount according to the data amount of the second data.

4. The data programming method according to claim 1, further comprising:

calculating the first writable data amount according to a capacity of one of the first type physical erasing units using the first programming mode, the number of the first type physical erasing units and a maximum erase count of one of the first type physical erasing units using the first programming mode.

5. The data programming method according to claim 1, wherein the physical erasing units are formed by a plurality of memory cells, and the number of bit data stored in each of the memory cells constructing the first type physical erasing units after the memory cells are programmed using the first programming mode is less than the number of bit data stored in each of the memory cells constructing the second type physical erasing units after the memory cells are programmed using the second programming mode.

6. The data programming method according to claim 1, further comprising:

setting the change ratio according to a total capacity of the first type physical erasing units.

7. A memory control circuit unit for controlling a rewritable non-volatile memory module, wherein the rewritable non-volatile memory module comprises a plurality of physical erasing units, the memory control circuit unit comprising:

a host interface configured to be coupled to a host system;

a memory interface configured to be coupled to the rewritable non-volatile memory module; and a memory management circuit coupled to the host interface and the memory interface, wherein the memory management circuit is configured to divide the physical erasing units into a plurality of first type physical erasing units and a plurality of second type physical erasing units, wherein a programming mode of the first type physical erasing units is a first programming mode, and a programming mode of the second type physical erasing units is a second programming mode, wherein the memory management circuit is further configured to set the first type physical erasing units as a current writing area and record a current writing data amount, wherein the memory management circuit is further configured to calculate a first data amount threshold according to a first writable data amount of the first type physical erasing units and a change ratio, wherein the memory management circuit is further configured to receive first data, wherein the memory management circuit is further configured to determine whether the current writing data amount is less than the first data amount threshold, wherein if the current writing data amount is less than the first data amount threshold, the memory management circuit is further configured to issue a command sequence to program the first data into at least one physical erasing unit of the first type physical erasing units using the first programming mode and update the current writing data amount according to a data amount of the first data, wherein if the current writing data amount is not less than the first data amount threshold, the memory management circuit is further configured to set the second type physical erasing units as the current writing area, reset the current writing data amount, issue a command sequence to program the first data into at least one physical erasing unit of the second type physical erasing units using the second programming mode and update the current writing data amount according to the data amount of the first data.

8. The memory control circuit unit according to claim 7, wherein the memory management circuit is further configured to calculate a second data amount threshold according to a second writable data amount of the second type physical erasing units and the change ratio.

9. The memory control circuit unit according to claim 8, wherein the memory management circuit is further configured to receive second data, wherein the memory management circuit is further configured to determine whether the current writing data amount is less than the second data amount threshold, wherein if the current writing data amount is less than the second data amount threshold, the memory management circuit is further configured to issue a command sequence to program the second data into at least one physical erasing unit of the second type physical erasing units using the second programming mode and update the current writing data amount according to a data amount of the second data, wherein if the current writing data amount is not less than the second data amount threshold, the memory management circuit is further configured to set the first type physical erasing units as the current writing area, reset the current writing data amount, issue a command sequence to program the second data into at least one of the first type physical erasing units using the first programming mode and update the current writing data amount according to the data amount of the second data.

10. The memory control circuit unit according to claim 7, wherein the memory management circuit is further configured to calculate the first writable data amount according to a capacity of one of the first type physical erasing units using the first programming mode, the number of the first type physical erasing units and a maximum erase count of one of the first type physical erasing units using the first programming mode.

11. The memory control circuit unit according to claim 7, wherein the physical erasing units are formed by a plurality of memory cells, and the number of bit data stored in each of the memory cells constructing the first type physical erasing units after the memory cells are programmed using the first programming mode is less than the number of bit data stored in each of the memory cells constructing the second type physical erasing units after the memory cells are programmed using the second programming mode.

12. The memory control circuit unit according to claim 7, wherein the memory management circuit is further configured to set the change ratio according to a total capacity of the first type physical erasing units.

13. A memory storage device, comprising:
a connection interface unit configured to be coupled to a host system;
a rewritable non-volatile memory module comprising a plurality of physical erasing units; and
a memory control circuit unit coupled to the connection interface unit and the rewritable non-volatile memory module,
wherein the memory control circuit unit is configured to divide the physical erasing units into a plurality of first type physical erasing units and a plurality of second type physical erasing units,
wherein a programming mode of the first type physical erasing units is a first programming mode, and a programming mode of the second type physical erasing units is a second programming mode,
wherein the memory control circuit unit is further configured to set the first type physical erasing units as a current writing area and record a current writing data amount,
wherein the memory control circuit unit is further configured to calculate a first data amount threshold according to a first writable data amount of the first type physical erasing units and a change ratio,
wherein the memory control circuit unit is further configured to receive first data, wherein the memory control circuit unit is further configured to determine whether the current writing data amount is less than the first data amount threshold, wherein if the current writing data amount is less than the first data amount threshold, the memory control circuit unit is further configured to issue a command sequence to program the first data into at least one physical erasing unit of the first type physical erasing units using the first programming mode and update the current writing data amount according to a data amount of the first data, wherein if the current writing data amount is not less than the first data amount threshold, the memory control circuit unit is further configured to set the second type physical erasing units as the current writing area, reset the current writing data amount, issue a command sequence to program the first data into at least one physical erasing unit of the second type physical erasing units using the second programming mode and update the current writing data amount according to the data amount of the first data.

14. The memory storage device according to claim 13, wherein the memory control circuit unit is further configured to calculate a second data amount threshold according to a second writable data amount of the second type physical erasing units and the change ratio.

15. The memory storage device according to claim 14, wherein the memory control circuit unit is further configured to receive second data,
wherein the memory control circuit unit is further configured to determine whether the current writing data amount is less than the second data amount threshold, wherein if the current writing data amount is less than the second data amount threshold, the memory control circuit unit is further configured to issue a command sequence to program the second data into at least one physical erasing unit of the second type physical erasing units using the second programming mode and update the current writing data amount according to a data amount of the second data, wherein if the current writing data amount is not less than the second data amount threshold, the memory control circuit unit is further configured to set the first type physical erasing units as the current writing area, reset the current writing data amount, issue a command sequence to program the second data into at least one of the first type physical erasing units using the first programming mode and update the current writing data amount according to the data amount of the second data.

16. The memory storage device according to claim 13, wherein the memory control circuit unit is further configured to calculate the first writable data amount according to a capacity of one of the first type physical erasing units using the first programming mode, the number of the first type physical erasing units and a maximum erase count of one of the first type physical erasing units using the first programming mode.

17. The memory storage device according to claim 13, wherein the physical erasing units are formed by a plurality of memory cells, and the number of bit data stored in each of the memory cells constructing the first type physical erasing units after the memory cells are programmed using the first programming mode is less than the number of bit data stored in each of the memory cells constructing the second type physical erasing units after the memory cells are programmed using the second programming mode.

18. The memory storage device according to claim 13, wherein the memory control circuit unit is further configured to set the change ratio according to a total capacity of the first type physical erasing units.

* * * * *